United States Patent [19]
Abou Hassan

[11] Patent Number: 5,687,193
[45] Date of Patent: Nov. 11, 1997

[54] MANCHESTER CODER/DECODER

[75] Inventor: Salman Abou Hassan, Caen, France

[73] Assignees: France Telecom, Paris; La Poste, Boulogne-Billancourt Cedex, both of France

[21] Appl. No.: 665,799

[22] Filed: Jun. 17, 1996

[30] Foreign Application Priority Data

Jun. 22, 1995 [FR] France ................... 95 07491

[51] Int. Cl.⁶ .................. H04L 27/32; H04L 27/22
[52] U.S. Cl. ............................ 375/282; 375/333
[58] Field of Search ..................... 375/282, 333, 375/361; 341/70, 68; 360/41

[56] References Cited

U.S. PATENT DOCUMENTS

| | | |
|---|---|---|
| 4,918,296 | 4/1990 | Fujisaka et al. . |
| 5,127,023 | 6/1992 | Tash et al. ................... 375/282 |

FOREIGN PATENT DOCUMENTS

| | | |
|---|---|---|
| 486072 | 5/1992 | European Pat. Off. . |
| 2644952 | 9/1990 | France . |
| 4214966 | 1/1993 | Germany . |

OTHER PUBLICATIONS

Applied Optics, vol. 31, No. 12, Apr. 1992, pp. 2001-2004, A. J. Al-Sammak et al., "Manchester Encoder-Decoder for Optical Data Communication Links".

Elektronik, No. 9, Apr. 1991, pp. 118-120, R. Sander et al., "Asics fur die Objekterkennung".

Electronic Design, vol. 34, No. 7, pp. 105-111, R. Duncan et al., "Programmable Logic Places A Gate-Array Foundry at Every Designer's Fingertips".

Primary Examiner—Stephen Chin
Assistant Examiner—Betsy Lee Deppe
Attorney, Agent, or Firm—Pearne, Gordon, McCoy & Granger LLP

[57] ABSTRACT

The Manchester coder/decoder of the invention includes the following modules. A synchronization signal generation module (11), gives the clocks' start signal. A module (12) for the synchronization and generation of clocks generates the transmission/coding and decoding clocks and a low frequency clock. A decoding module (13) includes a flip-flop driven by the decoding clock. The decoding is a simple sampling of the input signal of the Manchester coded data which is to be decoded during the reception phase. A coding module (14) carries out an "OR EXCLUSIVE" function between the input signal to be coded in Manchester code and the transmission clock.

13 Claims, 1 Drawing Sheet

MANCHESTER CODER/DECODER

DESCRIPTION

1. Technical Field

This invention relates to a Manchester coder/decoder.

2. State of the Prior Art

The field of the invention is that of no-contact cards of all types: proximity cards, medium and long distance cards, monofrequency cards, remotely powered or powered by battery, multifrequency remotely powered cards. The field of the invention is also that of electronic labels.

The exchange protocols used in transmissions between a no-contact card and its reader start with coding of transmitted information. The essential objective of the coding is to avoid the transmission of a series of "0" bits. In this case, the Manchester code is the code most used. But this code introduces an extra practical difficulty for the decoding of the data whether on the card side or the reader side. If the creation of the Manchester coding is trivial, it can be easily carried out with operations of the "OR EXCLUSIVE" type. The decoding operation is much more complex and necessitates the introduction of delay lines in the decoding chain. Particular care must be taken with the synchronisation of the transmission clocks on the card side and the reader side, in both transmission directions.

The object of the invention is to propose a device which carries out Manchester type coding/decoding, the innovation being in the decoding part, this device ensuring both the generation of the transmission clock and its synchronisation, the transmission clock being generated from the HF frequency regenerated in the analog head.

DISCLOSURE OF THE INVENTION

The Manchester coder/decoder of the invention includes the following modules:

a synchronisation signal generation module: this module is of primary importance: it gives the start signal for the clocks, particularly the decoding clock; which allows the decoder to line itself up with respect to a reference time known as T0;

a module for the synchronisation and generation of the clocks: this module generates the transmission/coding and decoding clocks and a low frequency clock. These clocks are used inside the coder/decoder. They also have outputs to the outside in order to synchronise the other circuits with the coder/decoder (reception, transmission, etc. . . . )

a decoding module: the Manchester decoding is carried out to a great extent, by the preceding module which is generating a precise decoding clock. The edges of this clock are always positioned at the same place on a received bit. This results in a very simple decoder which is reduced to a flip-flop driven by the decoding clock. In effect, the decoding is a simple sampling of the input signal of Manchester coded data to be decoded, during the reception phase, carried out at the leading edge of the clock (at the trailing edge for an indirect code);

a coding module: this module carries out an "OR EXCLUSIVE" function between the input signal of data which is to be encoded into Manchester code during the transmission phase, and the transmission clock.

It is characterised in that only the data to be decoded suffice for the decoding, no information on the coding clock being necessary for the decoding.

The coder/decoder of the invention operates with two clocks at the defined transmission frequency, for example 9600 bauds: one coding clock and one decoding clock.

The first coding clock (during transmission) is generated from the HF (high frequency) signal using a frequency divider. This clock is resynchronised onto the coded signal during reception. The phasing is carried out on the first trailing edge of the received signal, which is considered as time zero (T0) for the creation of the second clock.

The second decoding clock is also generated from the HF signal, using the same frequency divider that generates the coding clock, this clock having a specified delay, for example, of ¼ bit with respect to the coding clock. The decoding occurs by sampling the input line on the leading edge of the decoding clock. In the case of an indirect Manchester code, the delay can be 3T/4.

The coder/decoder of the invention has been produced in the form of a macro-cell integrated into an ASIC ("Application Specific Integrated Circuits"). Apart from the module which is the object of the invention, the ASIC integrates the analog head, a memory, for example, of the EEPROM ("Electrically Erasable Programmable Read Only Memory") type and a logic part which manages the transmission/reception protocol and the read/write in the memory. This ASIC has been used in two applications: an electronic label and a no-contact card.

The module of the invention has also been produced in the form of a programmable circuit (FPGA: "Field Programmable Gate Array" or programmable component). In this form it can be used on the reader side.

The coder/decoder of the invention is of interest certainly for any no-contact system using two phase coding of data. Its strong points are:

it is completely digital. Its creation is very simple. The generation of the transmission clock and the decoding use the same resources. This results in a very compact module with low power consumption;

the no-contact card (or electronic label) is always synchronised with the reader. The principle is the same for the decoding system;

it is simple to use. It can be used equally well with a microprocessor and with cabled logic, for both sides of the system (reader and card).

DETAILED DESCRIPTION OF EMBODIMENTS

Figure 1:
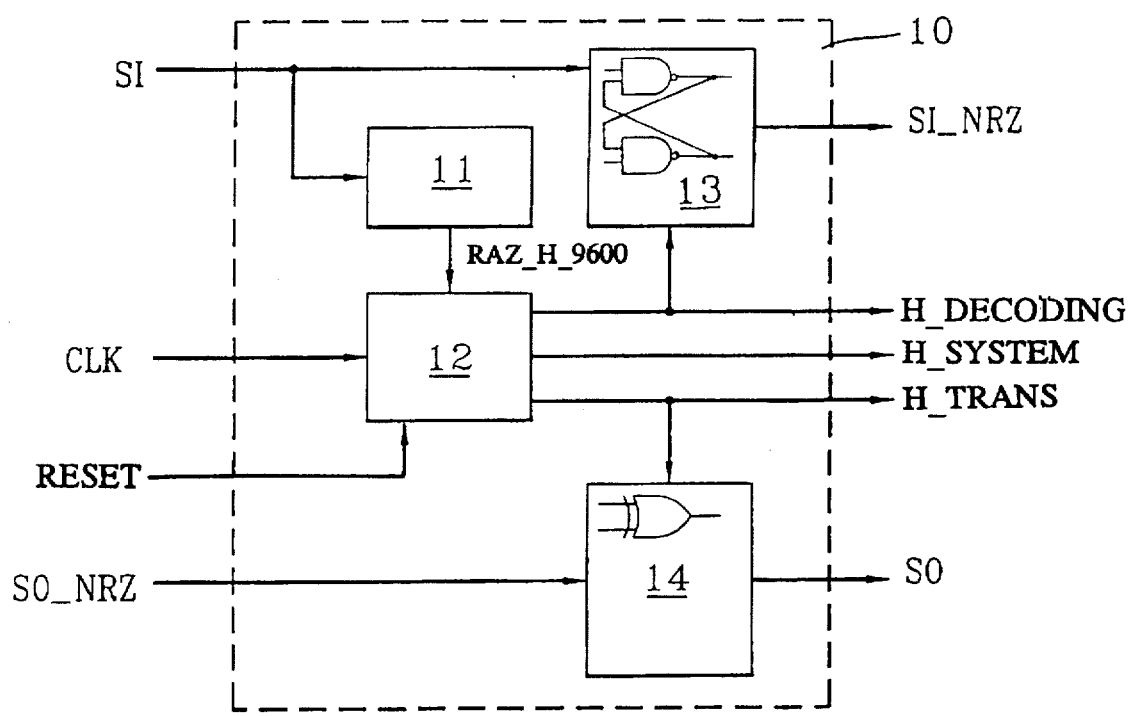
FIG. 1 shows the coder/decoder of the invention.

FIG. 1 shows a diagrammatic view of the coder/decoder of the invention. It is a device 10 with eight inputs/outputs:

a clock CLK at the frequency of the radiofrequency signal or RF, transmitted by the reader. This signal is the result of the recovery/regeneration of the RF signal by an analog interface. The frequency of the clock CLK is 4.9 MHz in the case given as an example. This frequency could be much higher but also could be lower. The frequency limitation is not due to the creation of the coder/decoder of the invention. This clock CLK is used to generate all the other clocks used in the coder/decoder of the invention;

an input SI of the Manchester coded data during the reception phase and destined to be decoded;

an input SO_NRZ of data destined to be encoded in Manchester code during the transmission phase an output SI_NRZ of data received on input SI and decoded by the coder/decoder of the invention;

an output SO of data received on the input SO_NRZ and Manchester coded by the coder/decoder of the invention;

a clock H_SYSTEM generated from the clock CLK and which is used to operate the rest of the logic. The frequency of this clock is low with respect to that of the clock CLK, which improves the energy balance of the circuit (a circuit produced in CMOS technology whose power consumption increases with frequency). In the case considered, the frequency is 150 kHz;

a transmission clock H_TRANS, generated from the clock H_SYSTEM. It is used to clock the transmission speed (9600 bauds in the case considered) as well as the Manchester encoding;

a Manchester decoding clock H_DECODING generated from the clock H_SYSTEM (9600 Hz in the case considered).

The transmission speed of the coder/decoder of the invention is not limited to 9600 bauds. The coder/decoder can be used with the range of transmission speeds that are most used (9600, 19 200 or any other speed).

As shown in FIG. 1, the Manchester coder/decoder of the invention includes the following modules:

a synchronisation signal generation module 11: this module has paramount importance. It gives the start signal for the clocks, particularly the decoding clock H_DECODING; which allows the decoder to line itself up with respect to a reference time known as T0.

To generate a synchronisation signal (RAZ_H_9600), this unit continuously monitors the line SI. From the moment it detects a transition from "1" to "0", it triggers a timer and resets itself to stand-by during, for example, 1 ms. The first transition from "1" to "0" arriving after 1 ms will provide it with reference time T0.

This waiting time of 1 ms allows it to avoid synchronising on parasitic transitions: this time delay is adjustable, it can be greater or smaller, depending on the performance of the demodulation system from the point of view of establishing a stable signal.

a module 12 for the synchronisation and generation of the clocks: this module generates the transmission/coding and decoding clocks and a low frequency clock. These clocks are used inside the coder/decoder. They also have outputs to the outside in order to synchronise the other circuits operating with the coder/decoder (reception, transmission, etc. . . . ):

the clock H_SYSTEM obtained from the clock CLK by a simple counter divider (division by 32 in our case): it is a permanent clock that starts directly after initialisation by a signal RESET;

The transmission clock H_TRANS: it fixes the transmission speed and is used in the Manchester encoding. It is generated from the clock H_SYSTEM by a counter divider (dividing by 16) reset to zero by a synchronisation signal generated by the first module 11 (RAZ_H_9600="1" forces the counter to 0; the counter is freed as soon as RAZ_H_9600 passes to "0"). The clock H_TRANS then operates from the start time T0, it is resynchronised at each pulse of the signal RAZ_H_9600;

The decoding clock H_DECODING: it is only used for Manchester decoding. It is generated in the same way as H_TRANS and with the same counter. It is disabled at the same time as clock H_TRANS when a pulse RAZ_H_9600="1", but starts with a delay with respect to H_TRANS when the signal RAZ_H_9600 passes to "0". This delay is ¼ of the duration of one bit in the case of direct Manchester code; it is ¾ of the duration of one bit in the case of indirect Manchester code (the duration of one bit at 9600 bauds is 104 µs). The delay that separates two leading (trailing) edges is always the same. A frequency shift of clock H_TRANS also affects clock H_DECODING in the same ratio;

clock CLK is available both in the reader and in the card. If the coder/decoder is used on both sides, the transmission clock H_TRANS, being generated in the same way from signal CLK, is synchronous in the two devices. In the case where the coder/decoder is only used on the card side, the card clock H_TRANS is controlled by the reader clock. In both cases, synchronisation on the coder/decoder side is always assured.

A decoding module 13: the Manchester decoding is carried out to a great extent by the preceding module which generates a precise decoding clock H_DECODING. The edges of this clock are always positioned at the same place in a received bit. This results in a very simple decoder which is reduced to a flip-flop driven by the decoding clock. In effect, the decoding is a simple sampling of the input signal SI of Manchester coded data destined to be decoded, during the reception phase, carried out at the leading edge of the clock (at the trailing edge for an indirect code).

A coding module 14: this module carries out an "OR EXCLUSIVE" function between the input signal SO_NRZ of data which is to be encoded into Manchester code during the transmission phase, and the transmission clock H_TRANS.

The coder/decoder 10 of the invention operates with two clocks at the defined transmission frequency, for example 9600 bauds: one coding clock and one decoding clock.

The first clock is used for the encoding (during transmission). It is generated from the HF signal using a frequency divider. This clock is resynchronised onto the coded signal during reception. The phasing is carried out on the first trailing edge of the received signal, which is considered as time zero (T0) for the creation of the second clock.

Figure 2:
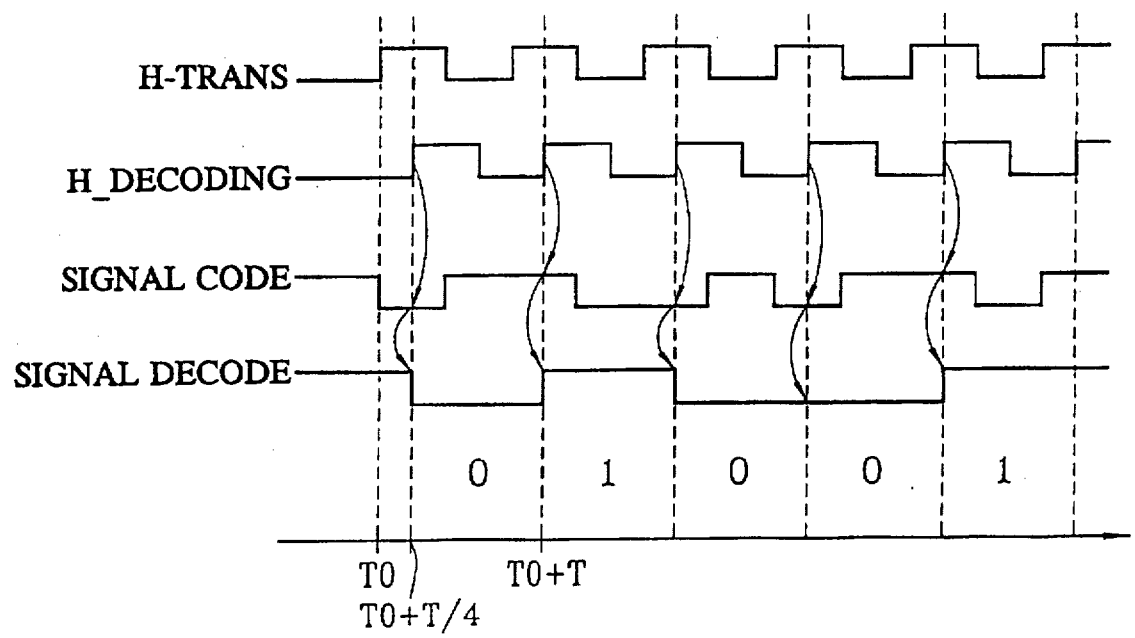
FIG. 2 shows a timing diagram of the coding and decoding clocks.

The decoding clock is also generated from the HF signal, using the same frequency divider that generates the coding clock, this clock having a specified delay, for example, of ¼ bit with respect to the coding clock. The phasing of this clock is carried out at time T0+T/4. The decoding occurs by sampling the input line on the leading edge of the decoding clock as shown in FIG. 2. Examples of a coded signal (SIGNAL CODE) and a decoded signal (SIGNAL DECODE) are shown.

The production of the coder/decoder of the invention is very simple which is what gives it its originality and its interest.

The coder/decoder of the invention has been created in the hardware description language VHDL ("Very High Speed Integrated Circuit Hardware Description Language"). Its behaviour has been simulated and its operation verified. The realisation at the hardware level has been carried out by a synthesis within a library of "standard cells". The splitting up into modules in FIG. 1 corresponds exactly to the operational splitting up described in VHDL. The description in VHDL language is given in an appendix.

The coder/decoder of the invention has been produced in the form of a macro-cell integrated into an ASIC. Apart from the module which is the object of the invention, the ASIC integrates the analog head, a memory, for example, of the EEPROM type and a logic part which manages the transmission/reception protocol and the read/write in the memory. This ASIC has been used in two applications: an electronic label and a no-contact card.

The module of the invention has also been produced in the form of a programmable circuit (FPGA). In this form it can be used on the reader side.

In an example of producing the coder/decoder of the invention produced has the following parameters:

HF clock at 1.87 MHz;

transmission clock at 9600 Hz;

direct Manchester code: a "1" bit is coded by the two bits "10"; a "0" bit is coded by two bits "01"; the duration of a coded Manchester bit is equal to half that of a non-coded bit. The real speed of transmission is therefore 19200 bauds (on the other hand, indirect Manchester encodes a "1" bit as "01" and a "0" bit as "10").

APPENDIX

DESCRIPTION IN VHDL LANGUAGE

I - External view coder/decoder of the invention and breakdown into modules

```
        library IEEE;
            use IEEE.std_logic_1164.all;
            use IEEE.std_logic_arith.all;
        entity CODEC_M is
5           Port    (CLK         : in      STD_ULOGIC;
                    H_TRANS      : out     STD_ULOGIC;
                    H_SYSTEM     : out     STD_ULOGIC;
                    H_DECODING   : out     STD_ULOGIC;
                    RESET        : in      STD_ULOGIC;
10                  SI_NRZ       : out     STD_ULOGIC;
                    SO_NRZ       : in      STD_ULOGIC;
                    SI           : in      STD_ULOGIC;
                    SO           : out     STD_ULOGIC);
        end CODEC_M
15
        architecture SCHEMATIC of CODEC_M is signal H_TRANS_L        : STD_ULOGIC;
            signal RAZ_H_9600       : STD_ULOGIC;
20          signal H_DECODING_L     : STD_ULOGIC;
```

SP 10278 C/DB

14

```
         signal H_SYSTEM            : STD_ULOGIC;

component SYNCHRO 5           port (RESET           : in      STD_ULOGIC;
                   H_SYSTEM        : in      STD_ULOGIC;
                   SI              : in      STD_ULOGIC;
                   RAZ_H_9600      : in      STD_ULOGIC);
             end component
10
         component CLOCKS
             port    (RESET         : in      STD_ULOGIC;
                     RAZ_H_9600    : in      STD_ULOGIC;
                     CLK           : in      STD_ULOGIC;
15                   H_DECODING    : out     STD_ULOGIC;
                     H_SYSTEM      : buffer  STD_ULOGIC;
                     H_TRANS       : out     STD_ULOGIC);
             end component;

20       component CODER
             port    (SO            : out     STD_ULOGIC;
                     SO_NRZ        : in      STD_ULOGIC;
                     H_TRANS       : in      STD_ULOGIC;
                     RESET         : in      STD_ULOGIC);
25           end component;
```

SP 10278 C/DB

15

```
       component DECODER
       port     (SI              : in     STD_ULOGIC;
                 SI_NRZ          : out    STD_ULOGIC;
                 H_DECODING      : in     STD_ULOGIC;
 5               RESET           : in     STD_ULOGIC);
       end component;

begin
                H_TRANS          ⇐ H_TRANS_L;
10              H_DECODING       ⇐ H_DECODING_L;
                H_SYSTEM         ⇐ H_SYSTEM_L;

I_1 : SYNCHRO
             port map (RESET            ⇒ RESET;
15                     H_SYSTEM         ⇒ H_SYSTEM_L;
                       SI               ⇒ SI;
                       RAZ_H_9600       ⇒ RAZ_H_9600);

I_2: CLOCKS
20           port map (RESET            ⇒ RESET;
                       RAZ_H_9600       ⇒ RAZ_H_9600;
                       CLK              ⇒ CLK;
                       H_DECODING       ⇒ H_DECODING_L;
                       H_SYSTEM         ⇒ H_SYSTEM_L);
25                     H_TRANS          ⇒ H_TRANS_L;
```

SP 10278 C/DB

```
                                16

I_4:  CODER
                port map (SO           ⇒   SO;
                          SO_NRZ       ⇒   SI_NRZ;
                          H_TRANS      ⇒   H_TRANS_L;
 5                        RESET        ⇒   RESET);

I_5:  DECODER
                port map (SI           ⇒   SI;
                          SI_NRZ       ⇒   SI_NRZ;
10                        H_DECODING   ⇒   H_DECODING_L;
                          RESET        ⇒   RESET);

end SCHEMATIC

15      -- pragma translate_off
        configuration CFG_CODEC_M_BEHAVIORAL of DECODER is
        for BEHAVIORAL end for;
20
        end CFG_CODEC_M_BEHAVIORAL;
```

SP 10278 C/DB

17

II - Synchronisation signal generation module (11)

```
        library IEEE;
            use IEEE.std_logic_1164.all;
5           use IEEE.std_logic_arith.all;

entity SYNCHRO is
            port (RESET       : in     STD_ULOGIC;
                  H_SYSTEM    : in     STD_ULOGIC;
10                SI          : in     STD_ULOGIC;
                  RAZ_H_9600  : out    STD_ULOGIC);
        end SYNCHRO architecture BEHAVIORAL of SYNCHRO is
15      _____

P_synchro: process (RESET,H_SYSTEM, SI)
            type TYPE_STATE is (E_INIT, E_SYNC0, E_SYNC1,
            E_SYNC2, E_SYNC3, E-STNC4, E_SYNC5, );
20      constant K_1ms :    INTEGER: = 154; -delay of 1 ms:
        1ms*153.6 khz
        variable STATE : TYPE_STATE;
        variable K     :   INTEGER range 0 to 2**9-1; - L max >
        K_2_7ms
25
            begin
```

SP 10278 C/DB

```
                            18
              if RESET = '0' then
                   RAZ_H_9600 ⇐ '1'
                   STATE:= E_INIT
              eleif  H_SYSTEM  =  '1' and H_SYSTEM event then
5             case  STATE is when E_INIT    ⇒   RAZ_H_9600 ⇐ '0';
                                      STATE    := E_SYNC0;

10             _____ DELAY FIRST TRANSITION TO '0' OF SI when E_SYNC0   ⇒  if SI = '1' then
                                        STATE :=  E_SYNC1;
                                        end if;
15                 when E_SYNC1   ⇒  if SI = '0' then
                                        K := K_1ms; -delay to
                                     avoid triggering
                                     -on parasitic transitions
                                        STATE :=  E_SYNC2;
20                                      end if;
                   when E_SYNC2      ⇒  if K = '0' then
                                        STATE :=  E_SYNC3;
                                        else
                                        K := K-1;
25                                      end if;

when E_SYNC3      ⇒  if SI = '1' then

SP 10278 C/DB
```

19

```
                                      STATE  :=  E_SYNC4;
                                      end if;

when E_SYNC4      ⇒   if SI = '0' then
                                      RAZ_H_9600 ⇐  '1'
                                      STATE  :=  E_SYNC5;
                                      end if;

when E_SYNC5      ⇒   RAZ_H_9600 ⇐  '0';
                                      STATE  :=  E_SYNC0;

end case;
    end if;
    end process P_synchro
```

_____END PROCESS SYNCHRO_____ end BEHAVIORAL;

-- pragma translate_off
configuration CFG_SYNCHRO_BEHAVIORAL of SYNCHRO is
        for BEHAVIORAL end for;

end CFG_SYNCHRO_BEHAVIORAL;

SP 10278 C/DB

III - Clock generation module (12)

```
library IEEE;
    use IEEE.STD_LOGIC_1164.all;

entity CLOCK is
        Port (RESET        : in      STD_ULOGIC;
              RAZ_H_9600   : in      STD_ULOGIC;
              CLK          : in      STD_ULOGIC;
              H_DECODING   : out     STD_ULOGIC;
              H_SYSTEM     : buffer  STD_ULOGIC;
              H_TRANS      : out     STD_ULOGIC);
        end CLOCKS;

architecture BEHAVIORAL of CLOCKS is
        constant K_BIT: Integer := 16; 104us*4.9152mhz:
        duration of 1 bit at 9600 bauds
        constant K_HOR: Integer := 32;

begin

P_H_SYSTEM : process  (RESET, CLK)
        variable K_153KHZ : INTEGER range 0 to K_HOR-1;
begin
        if RESET = '0' then
           K_153KHZ := 0;
           H_SYSTEM <= '1';
```

SP 10278 C/DB

21

```
          elsif CLK = '1' and CLK' event then
              if K_153KHZ = 0 then
                  H_SYSTEM   <= '0';
                  K_153KHZ := K_HOR-1;
5         elsif K_153KHZ  = K_HOR/2 then
                  H_SYSTEM   <= '1';
                  K_153KHZ := K_153KHZ-1;
              else
                  K_153KHZ := K_153KHZ-1;
10        end if;

end if;
    end process P_H_SYSTEM;

15  P_CLOCKS: process (RESET, H_SYSTEM, RAZ_H_9600)
        variable K       : Integer range 0 to K_BIT-1;

begin 20      if RAZ_H_9600  = '1' then
            K:= K_BIT61;
            H_DECODING   <= '0';
            H_TRANS    <= '0';

25      elsif H_SYSTEM  = '1' and H_SYSTEM' event then if K  = K_BIT-1 then
```

SP 10278 C/DB

22

```
              H_TRANS    <= '1';   -start clock h_9600
              H_DECODING <= '0';
              K := K-1;

elsif  K = 3*K_BIT/4+1 then
              H_DECODING <= '1';   -start decoding clock
              K := K-1;

elsif  K = K_BIT/2-1 then
              H_TRANS    <= '0';   -T/2 H_TRANS
              K := K-1;

elsif  K = K_BIT/4+1 then
              H_DECODING <= '0';   ---T/2 decoding clock
              K := K-1;

elsif  K = 0 then
              K := K_BIT-1
         else
              K := K-1;
         end if;

end if;
       end process P_Clocks;

end BEHAVIORAL;

SP 10278 C/DB
```

23

```
        -- pragma translate_off
        configuration CFG_CLOCKS_BEHAVIORAL of CLOCKS is
            for BEHAVIORAL end for;

end CFG_CLOCKS_BEHAVIORAL;
```

24

IV - Decoding module (13)

```
    library IEEE;
        use IEEE.std_logic_1164.all;
        use IEEE.std_logic_arith.all;

entity DECODER is
        Port (SI         : IN     STD_ULOGIC;
              SI_NRZ     : OUT        STD_ULOGIC;
              H_DECODING : IN     STD_ULOGIC;
              RESET      : IN     STD_ULOGIC);
    end DECODER;

architecture BEHAVIORAL of DECODER is begin

-- SI         : Input of coded data
        -- SO_NRZ     : Output of decoded data
        -- H_DECODING : Transmission clock adopted
        -- RESET      : Initialisation of the circuit ===== Manchester Type Decoding
```

SP 10278 C/DB

```
                                    25

-- The decoding is carried out by sampling the
   signal code SI on the leading
                -- edge of the decoding clock H_DECODING 5        P_DECODING  : process begin
             wait until H_DECODING = '1';
             SI_NRZ  <=  SI
10           end process P_DECODING;

end BEHAVIORAL;

--  pragma translate_off
15       configuration CFG_DECODER_BEHAVIORAL of DECODER is
                for BEHAVIORAL end for;

20       end CFG_DECODER_BEHAVIORAL;
```

SP 10278 C/DB

26

V - Coding module (14)

```
library IEEE;
    use IEEE.std_logic_1164.all;
    use IEEE.std_logic_arith.all;

entity CODER is
    Port   (SO        : OUT   STD_ULOGIC;
            SO_NRZ    : IN    STD_ULOGIC;
            H_TRANS   : IN    STD_ULOGIC;
            RESET     : IN    STD_ULOGIC);
end CODER;

architecture BEHAVIORAL of CODER is begin

-- SO         : Output of coded data
    -- SO_NRZ     : Input of data to be encoded
    -- H_TRANS    : Transmission clock adopted
    -- RESET      : Initialisation of the circuit ===== Manchester Type Decoding
```

SP 10278 C/DB

27

```
          -- encoding by an "OR EXCLUSIVE" function
    between the transmission clock
          -- and the signal to be encoded, the function
    "NOT" is used to implement
          -- the direct Manchester code (a '0' is coded
    by "01"; a '1' by "10")

SO <= not (H_TRANS xor SO_NRZ);

end BEHAVIORAL;

-- pragma translate off
    configuration CFG_CODER_BEHAVIORAL of CODER is
          for BEHAVIORAL end for;

end CFG_CODER_BEHAVIORAL;
```

SP 10278 C/DB

What is claimed is:

1. A Manchester coder/decoder, operating without retiming a received Manchester coded input signal, the coder/decoder comprising the following modules:

a synchronization signal generation module, operated by the coded input signal and providing a start signal for clocks of the coder/decoder;

a module for the synchronization and generation of clocks which generate transmission/coding and decoding clocks and a low frequency clock, the decoding clock being synchronized to the received coded input signal;

a decoding module, which includes a flip-flop driven by the decoding clock, the decoding being a simple sampling of the input signal of the Manchester coded data which is to be decoded, during the reception phase;

a coding module, which carries out an "OR EXCLUSIVE" function between an NRZ input signal to be coded in Manchester code and the transmission/coding clock.

2. A Manchester coder/decoder according to claim 1, which operates the transmission/coding and decoding clocks at a defined transmission frequency.

3. A Manchester coder/decoder according to claim 2, in which the coding clock is generated from an HF clock signal using a frequency divider, the coding clock being resynchronized to the coded signal during reception and phasing of the coded clock being carried out on the first trailing edge of the received signal, the first trailing edge being taken as time zero for creation of the coding clock; and in which the decoding clock is generated from the HF signal using the same frequency divider which generates the coding clock, the decoding clock having a specific delay, wherein the decoding occurs by sampling the input signal at a leading edge of the decoding clock.

4. A Manchester coder/decoder according to claim 2, in which the two clocks operate at 9600 bauds.

5. A Manchester coder/decoder according to claim 1, which is produced in the form of a macro-cell integrated in an ASIC which also integrates the analog head, a memory and a logic section that manages the transmission/reception protocol and the read/write in the memory.

6. A Manchester coder/decoder according to claim 1, which is produced in the form of a programmable circuit.

7. A Manchester coder/decoder according to claim 1, which is used in the field of no-contact cards.

8. A Manchester coder/decoder according to claim 1, which is used in the field of electronic labels.

9. The Manchester coder/decoder of claim 1, wherein the synchronization signal generator is responsive to a first falling edge transition of the Manchester coded signal and including a timer to avoid starting clocks on a parasitic pulse; the synchronizing signal being generated on a first falling edge transition arriving after a time defined by the timer.

10. The Manchester coder/decoder of claim 9, in which two clocks with the same frequency are generated from a CLK signal using a frequency divider, the first clock being resynchronized with the received Manchester coded signal by the synchronizing signal being used in the coding process, the second clock having a specific delay with the first clock being used in the decoding process, the decoding occurring by sampling the Manchester coded signal at the rising edge of the decoding clock.

11. The Manchester coder/decoder of claim 10, which is produced in the form of a macro-cell integrated in an ASIC which also integrates an analog front-end, a memory and a logic section that manages the transmission/reception protocol and the read/write operations in the memory.

12. The Manchester coder/decoder of claim 11, which is designed with the VHDL high level description language and synthesized in a standard-cells library.

13. The Manchester coder/decoder of claim 12, which is used in the field of contactless cards and electronic labels.

* * * * *